United States Patent
Hsieh et al.

[11] Patent Number: 6,146,742
[45] Date of Patent: Nov. 14, 2000

[54] BARRIER/GLUE LAYER ON POLYSILICON LAYER

[75] Inventors: Wen-Yi Hsieh, Hsinchu; Chi-Rong Lin, Chang Hua Hsien; Horng-Bor Lu; Jenn-Tarng Lin, both of Hsinchu, all of Taiwan

[73] Assignee: United Microelectronics Corp., Hsin-Chu, Taiwan

[21] Appl. No.: 09/034,793

[22] Filed: Mar. 3, 1998

[30] Foreign Application Priority Data

Nov. 24, 1997 [TW] Taiwan ................. 86117572

[51] Int. Cl.$^7$ ................................ H01L 23/48
[52] U.S. Cl. .............. 428/209; 428/195; 428/210; 428/446; 428/457; 428/469; 428/472; 428/698
[58] Field of Search ................... 428/195, 209, 428/210, 446, 457, 469, 472, 698

[56] References Cited

U.S. PATENT DOCUMENTS

| | | | |
|---|---|---|---|
| 5,357,136 | 10/1994 | Yoshioka | 257/383 |
| 5,364,803 | 11/1994 | Lur et al. | 437/40 |
| 5,393,704 | 2/1995 | Huang et al. | 437/203 |
| 5,483,104 | 1/1996 | Godinho et al. | 257/758 |
| 5,504,038 | 4/1996 | Chien et al. | 437/192 |
| 5,734,200 | 3/1998 | Hsue et al. | 257/755 |
| 5,847,463 | 12/1998 | Trivedi et al. | 257/751 |
| 5,874,353 | 2/1999 | Lin et al. | 438/592 |

*Primary Examiner*—Archene Turner

[57] ABSTRACT

A method for forming a barrier/glue layer above the polysilicon layer of a MOS transistor gate comprising the step of providing a semiconductor substrate, and then forming a gate oxide layer above the substrate. Next, a polysilicon layer is formed over the gate oxide layer. Thereafter, a titanium layer is deposited over the polysilicon layer first, and then a titanium nitride layer is deposited above the titanium layer. This titanium/titanium nitride bi-layer is capable of increasing the adhesive strength with a subsequently deposited tungsten silicide layer, and preventing the peeling of the tungsten silicide layer. Furthermore, the titanium nitride layer acts as a barrier for fluorine atoms preventing their diffusion to the gate oxide layer/polysilicon layer interface, and affecting the effective thickness of the gate oxide layer. In the subsequent step, a tungsten suicide layer is formed above the titanium nitride layer. Finally, after an annealing operation, the titanium layer will react with the silicon in the polysilicon layer and the tungsten silicide layer to form a titanium silicide layer. Hence, the resistance of the polycide layer in a MOS transistor gate can be reduced.

11 Claims, 2 Drawing Sheets

BARRIER/GLUE LAYER ON POLYSILICON LAYER

CROSS-REFERENCE TO RELATED APPLICATION

This application claims the priority benefit of Taiwan application serial no. 86117572, filed Nov. 24, 1997, the full disclosure of which is incorporated herein by reference.

BACKGROUND OF THE INVENTION

1. Field of Invention

The present invention relates to a method for forming a structure having a barrier layer and a glue layer above a polysilicon layer. More particularly, the present invention relates to a method for forming a titanium/titanium nitride (Ti/TiN) layer above a polysilicon layer functioning as a barrier layer and a glue layer for an overlying tungsten silicide ($WSi_2$) layer.

2. Description of Related Art

FIG. 1 is a cross-sectional view showing a conventional MOS transistor gate structure. As shown in FIG. 1, the method of producing the MOS gate includes forming a gate oxide layer 2 over a semiconductor substrate 1, and then forming a doped polysilicon layer 3 over the gate oxide layer 2. Next, a tungsten silicide layer 4 is formed over the doped polysilicon layer 3. The doped polysilicon layer 3 and the tungsten silicide layer 4 together constitute a polycide layer, which acts as a conductive layer for the gate terminal. The doped polysilicon layer 3 is formed by a deposition using a low-pressure chemical vapor deposition (LPCVD) method followed by subsequent doping. The tungsten silicide layer 4 is also formed by depositing using a low-pressure chemical vapor deposition (LPCVD) method with tungsten hexafluoride ($WF_6$) as the gaseous source for tungsten.

The tungsten suicide that reacts and forms over the polysilicon layer 3 has a chemical formula of $WSi_x$, where the value of x is roughly between 2.6 to 2.8. The resistivity of the tungsten suicide layer is rather high, and is in the range of 700 to 900 Ω-cm. Because of the high value of x, the tungsten silicide is referred to as silicon-rich. In order to lower the resistance of the tungsten silicide layer, and hence reducing the resistance of the gate conductivity layer so that a high RC delay time is prevented, an annealing operation must be performed. After the annealing operation, the resistivity of the tungsten silicide is reduced to about 70 Ω-cm or below. Since the value of x in $WSi_x$ is now fallen to about 2.2 to 2.3, the tungsten silicide layer is now referred to as tungsten-rich. A 90% reduction in resistivity of the tungsten silicide layer due to annealing serves to lower the resistance of the polycide layer in the MOS gate considerably.

In the conventional method of forming a MOS gate polycide layer as described in FIG. 1 above, after a polysilicon layer 3 is formed over the gate oxide layer 2, the exposed portion of the polysilicon layer 3 will react in the presence of surrounding oxygen to form a layer of silicon dioxide known as a native oxide 5. The presence of a native oxide layer will lead to poor adhesion of the polysilicon layer 3 with the subsequently deposited $WSi_x$ layer. Furthermore, since the coefficient of expansion for a metallic thin film is many times greater than a silicon dioxide layer, peeling of the top $WSi_x$ layer as shown in FIG. 2 can happen after a high temperature processing treatment, for example, an annealing operation.

In addition, the deposition of tungsten silicide over the polysilicon layer 3 uses tungsten fluoride as the gaseous source for tungsten. Consequently, the tungsten silicide layer will contain some fluorine atoms. Later, these fluorine atoms can diffuse to the interface between the gate oxide layer 2 and the polysilicon layer 3, thereby affecting the effective thickness of the gate oxide layer 2.

In light of the foregoing, there is a need to provide a barrier layer for stopping the penetration of fluorine atoms as well as a glue layer for increasing the adhesion between a tungsten suicide layer and a polysilicon layer.

SUMMARY OF THE INVENTION

Accordingly, the present invention is to provide a barrier/glue layer above the polysilicon layer of a MOS transistor gate in order to reduce the adhesion problem and the influence of fluorine diffusion on the effective thickness of a gate oxide layer.

To achieve these and other advantages and in accordance with the purpose of the invention, as embodied and broadly described herein, the invention provides a method for forming a barrier/glue layer above the polysilicon layer of a MOS transistor gate. The method comprises the step of providing a semiconductor substrate, and then forming a gate oxide layer above the substrate. Next, a polysilicon layer is formed over the gate oxide layer. Thereafter, a titanium layer is deposited over the polysilicon layer first, and then a titanium nitride layer is deposited above the titanium layer. This titanium/titanium nitride bi-layer is capable of increasing adhesion with a subsequently deposited tungsten suicide layer, and preventing the peeling of the tungsten suicide layer. Furthermore, the titanium nitride layer acts as a barrier for fluorine atoms preventing their diffusion to the gate oxide layer/polysilicon layer interface, and affecting the effective thickness of the gate oxide layer. In the subsequent step, a tungsten suicide layer is formed above the titanium nitride layer. Finally, after an annealing operation, the titanium layer will react with the silicon in the polysilicon layer and the tungsten silicide layer to form a titanium silicide ($TiSi_2$) layer. Consequently, resistance of the polycide layer in a MOS transistor gate is greatly reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 (Prior Art) is a cross-sectional view showing a conventional MOS transistor gate structure.

DESCRIPTION OF THE PREFERRED EMBODIMENTS

Figure 1:
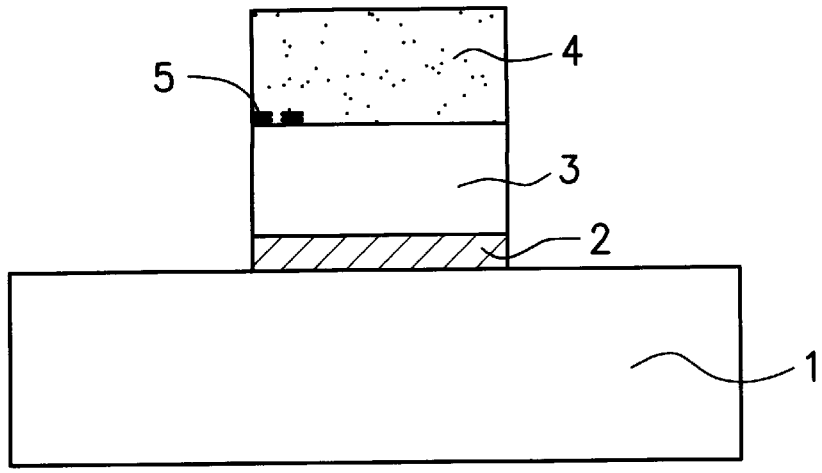
Figure 2:
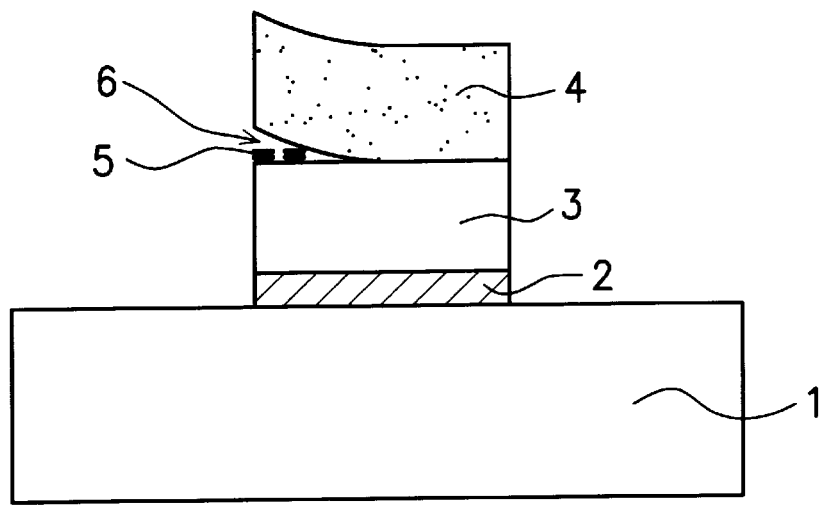
FIG. 2 (Prior Art) is a cross-sectional view showing a conventional MOS transistor gate structure with peeling of the tungsten silicide top layer.

Reference will now be made in detail to the present preferred embodiments of the invention, examples of which are illustrated in the accompanying drawings. Wherever possible, the same reference numbers are used in the drawings and the description to refer to the same or like parts.

FIGS. 3 through 6 are cross-sectional views showing the progression of manufacturing steps in producing a barrier/glue layer above the polysilicon layer of a MOS transistor gate and the subsequent steps in forming a complete gate structure according to one preferred embodiment of this invention.

Figure 3:
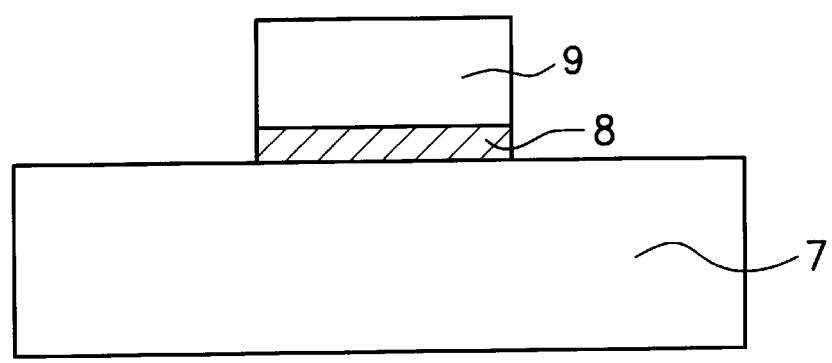
FIGS. 3 through 6 are cross-sectional views showing the progression of manufacturing steps in producing a barrier/glue layer above the polysilicon layer of a MOS transistor gate and the subsequent steps in forming a complete gate structure according to one preferred embodiment of this invention.

First, as shown in FIG. 3, a semiconductor substrate 7 is provided. Then, a gate oxide layer 8 is formed over the substrate 7, and then a polysilicon layer 9 is formed over the gate oxide layer 8. The gate oxide layer 8 and the polysilicon layer 9 can be formed by a conventional integrated circuit fabrication method using conventional materials. For example, the gate oxide layer 8 can be formed by a thermal oxidation method or a chemical vapor deposition method. The polysilicon layer 9 can be formed by a low-pressure chemical vapor deposition method using silane ($SiH_4$) as a gaseous reactant. If the reacting temperature for forming the polysilicon layer 9 is under 575° C., the deposited polysilicon. layer is mainly in the amorphous state. However, if the temperature is raised to between 575° C. to 650° C., polysilicon will be formed. Moreover, the degree of crystal formation will increase with an increase in temperature. Nevertheless, if the deposition temperature of the polysilicon layer is too high, the reaction will incline towards homogeneous nucleation, which will cause some degradation in the uniformity of deposition. Therefore, the temperature is preferably controlled within 600° C. to 650° C., and the pressure within the range of 0.3 to 0.6 torr.

Figure 4:
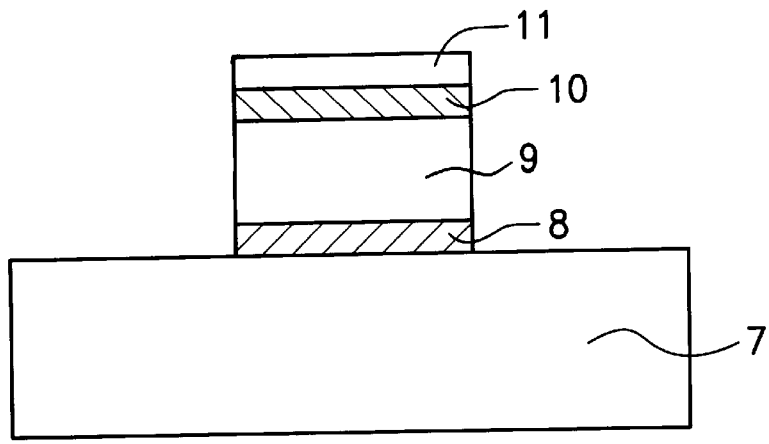

Next, as shown in FIG. 4, a titanium layer 10 is deposited over the polysilicon layer 9. The titanium layer 10 can be formed by a magnetron DC sputtering method that uses argon as the gaseous source. The titanium layer 10 preferably has a thickness of about 200 Å to 500 Å. Then, a titanium nitride layer 11 is deposited over the titanium layer 10. In general, one of two methods can be used for forming the titanium nitride layer 11. One method is to use a nitridation process, while the other method is to use a reactive sputtering process. In the nitridation process, a layer of titanium having a fixed thickness is first deposited over the wafer surface by a magnetron DC sputtering method. Then, the wafer is placed in a nitrogen-filled or ammonia-filled reaction chamber, and then heated to a high temperature for nitriding the titanium into a titanium nitride layer. In a reactive sputtering method, a titanium-containing metallic target and a mixture of reactive gases including argon and nitrogen are used. During the sputtering reaction, titanium atoms, which are dislodged from the target by the bombardment of ions, reacts with the dissociated nitrogen atoms in the plasma to form a layer of deposited titanium nitride on the wafer surface.

In general, the titanium nitride layer 11 functions as a barrier layer and preferably has a thickness of about 500 Å to 1500 Å. In addition, during DC sputtering or reactive sputtering, the pressure is preferably controlled within the range from a few mtorrs to a 100 mtorrs. The titanium/titanium nitride bi-layer is capable of increasing the adhesion between the polysilicon layer 9 below and the subsequently deposited tungsten silicide layer 12 above, thereby preventing the peeling of subsequently deposited tungsten suicide layer 12.

Figure 5:
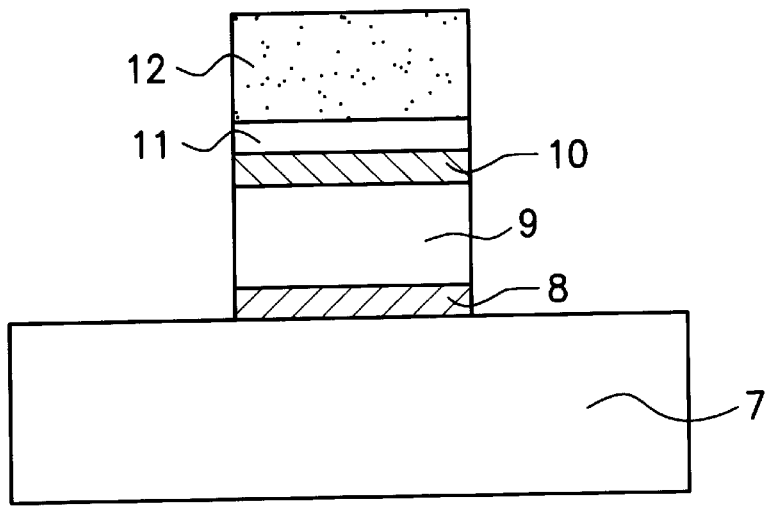

Next, as shown in FIG. 5, a tungsten silicide layer 12 is formed over the titanium nitride layer 11 using a chemical-vapor deposition method. This completes the fabrication process for the gate of a MOS transistor. The tungsten silicide layer 12 is formed by a low-pressure chemical vapor deposition method. Using tungsten hexafluoride as the gaseous source for tungsten, the tungsten hexafluoride reacts with silane to form the tungsten silicide layer 12 at a temperature of between 300° C. to 400° C. and an operating pressure of between 0.3 to 1.0 torr.

Because tungsten hexafluoride is used as a gaseous source for tungsten during the formation of tungsten silicide layer 12, the tungsten silicide layer 12 also contains fluorine atoms. In time, the fluorine atoms will diffuse to the interface between the gate oxide layer and the polysilicon layer. The presence of a titanium nitride layer 11 below the tungsten silicide layer 12 is able to stop the diffusion of fluorine atoms crossing into the gate oxide layer 8. Hence, the effective thickness of the gate oxide layer 8 can be maintained.

Figure 6:
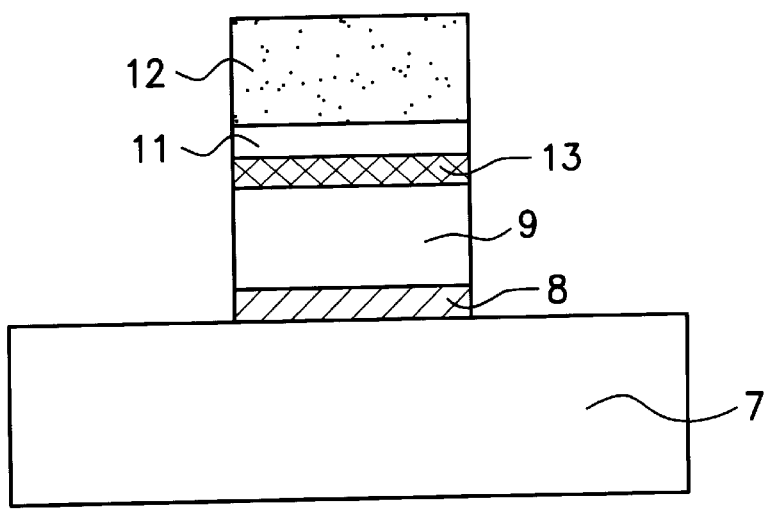

Finally, as shown in FIG. 6, an annealing operation is performed. During the annealing operation, the titanium layer 10 between the polysilicon layer 9 and the titanium nitride layer 11 reacts with the silicon atoms in the polysilicon layer 9 and the residual silicon atoms coming from the tungsten silicide layer 12 to form a titanium silicide layer 13.

In general, the resistivity of titanium silicide is about 20 $\Omega$-cm, the resistivity of $WSi_x$ is about 80 $\Omega$-cm, while the resistivity of titanium nitride is about 130 $\Omega$-cm. Through proper adjustment of the titanium/titanium nitride thickness ratio, resistance of the polycide layer in a MOS transistor gate can be reduced to a minimum.

In addition, since titanium suicide is a compound having a low resistance, the titanium sulicide layer formed from a metallic titanium layer in this invention is able to lower the resistance of the polycide layer in a MOS transistor gate considerably.

As a summary, the conductive layer in a MOS transistor gate fabricated according to this invention has a lower resistance than the same conductive layer made by a conventional method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A barrier/glue layer structure on a polysilicon layer comprising:

a semiconductor substrate having a gate electrode, which comprises:

an oxide layer located on the semiconductor substrate;

a polysilicon layer located on the polysilicon layer;

a conductive layer located on the polysilicon layer without a contact on the oxide layer within the structure;

a metal nitride layer located on the conductive layer; and a metal silicide layer located on the metal nitride layer.

2. The structure of claim 1, wherein the conductive layer includes a titanium layer.

3. The structure of claim 1, wherein the conductive layer includes a titanium silicide layer.

4. The structure of claim 1, wherein the metal nitride layer includes a titanium nitride layer.

5. The structure of claim 1, wherein the metal silicide layer includes a tungsten silicide layer.

6. The structure of claim 1, wherein the conductive layer between the polysilicon layer and the metal silicide layer together with the metal nitride layer acts as a barrier layer and a glue layer.

7. A barrier/glue layer structure on a polysilicon layer comprising:
- a semiconductor substrate;
- a gate oxide layer located on the semiconductor substrate;
- a polysilicon layer located on the polysilicon layer;
- a preliminary metal layer located on the polysilicon layer;
- a metal nitride layer located on the first metal silicide layer; and
- a second metal silicide layer located on the metal nitride layer, wherein the preliminary metal layer is converted to a first metal silicide layer by annealing.

8. The structure of claim 7, wherein the first metal silicide layer comprises titanium silicide.

9. The structure of claim 7, wherein the structure forms a gate electrode.

10. The structure of claim 7, wherein the metal nitride layer comprises titanium nitride.

11. The structure of claim 7, wherein second metal silicide layer comprises tungsten silicide.

* * * * *